United States Patent [19]
Ware et al.

[11] Patent Number: 5,434,817
[45] Date of Patent: Jul. 18, 1995

[54] DYNAMIC RANDOM ACCESS MEMORY SYSTEM

[75] Inventors: Frederick A. Ware, Los Altos Hills; John B. Dillon; Richard M. Barth, both of Palo Alto; Billy W. Garrett, Jr., Mountain View; John G. Atwood, Jr., San Jose; Michael P. Farmwald, Portola Valley, all of Calif.

[73] Assignee: Rambus, Incorporated, Mountain View, Calif.

[21] Appl. No.: 333,869

[22] Filed: Nov. 3, 1994

Related U.S. Application Data

[63] Continuation of Ser. No. 71,177, Jun. 2, 1993, abandoned.

[51] Int. Cl.⁶ ............................ G11C 7/00; G06F 12/06
[52] U.S. Cl. ............................ 365/189.01; 365/189.02; 365/230.01; 365/230.02
[58] Field of Search ............. 365/189.01, 189.02, 365/189.03, 230.01, 230.02, 233

[56] References Cited

U.S. PATENT DOCUMENTS

| | | |
|---|---|---|
| 3,821,715 | 6/1974 | Hoff, Jr. et al. . |
| 4,286,321 | 8/1981 | Baker et al. . |
| 4,333,142 | 6/1982 | Chesley . |
| 4,434,474 | 2/1984 | Best et al. ............................ 364/900 |
| 4,649,516 | 3/1987 | Chung et al. . |
| 4,967,398 | 10/1990 | Jamoua et al. ........................ 365/230 |
| 4,979,145 | 12/1990 | Remington et al. ................. 364/900 |
| 5,027,329 | 6/1991 | Foss ................................. 365/230.02 |
| 5,115,411 | 5/1992 | Kass et al. ............................. 365/189 |
| 5,119,331 | 6/1992 | Sussman ........................... 365/189.01 |
| 5,142,276 | 8/1992 | Moffat . |
| 5,184,320 | 2/1993 | Dye . |
| 5,243,703 | 9/1993 | Farmwald et al. . |
| 5,257,237 | 10/1993 | Aranda et al. .................. 365/230.05 |
| 5,265,053 | 11/1993 | Naradone et al. ................... 365/193 |
| 5,278,974 | 1/1994 | Lemmon et al. ...................... 395/550 |

FOREIGN PATENT DOCUMENTS

| | | | |
|---|---|---|---|
| 54-128226 | 12/1979 | Japan ............................ G11C 7/00 |
| 57-20979 | 5/1982 | Japan ............................ G11C 7/00 |
| 58-53082 | 6/1983 | Japan ......................... G11C 11/34 |
| WO91/16680 | 1/1991 | WIPO ........................ G06F 13/16 |
| WO79/00914 | 11/1994 | WIPO ........................ G11C 11/40 |

*Primary Examiner*—Viet Q. Nguyen
*Attorney, Agent, or Firm*—Blakely, Sokoloff, Taylor & Zafman

[57] ABSTRACT

As interfaces to DRAMs become more advanced and higher performance, the interfaces and signal lines required to support the interface become more expensive to implement. Therefore, it is desirable to minimize the number of signal lines and maximize the bandwidth of the signal lines interfacing to the DRAM in order to take advantage of the high performance of the signal lines in the interface. In the DRAM memory system of the present invention, the address and control lines and are combined and the information multiplexed such that the DRAM pins have roughly equal information rate at all times.

38 Claims, 19 Drawing Sheets

DYNAMIC RANDOM ACCESS MEMORY SYSTEM

This is a continuation of application Ser. No. 08/071,177, filed Jun. 2, 1993, now abandoned.

BACKGROUND OF THE INVENTION

1. Field of the Invention

The present invention relates to dynamic random access memory (DRAM) and structure and methods for accessing the same. More particularly, the present invention relates reducing the number of lines required to access DRAM.

2. Art Background

Dynamic random access memory (DRAM) components provide an inexpensive solid-state storage technology for today's computer systems. Digital information is maintained in the array in the form of a charge stored on a two-dimensional array of capacitors as is shown in FIG. 1. Accessing the array is a two step process. First, a row address is provided and held in a latch. This row address selects one of the rows of the DRAM by selecting a corresponding word line. The other word lines are deselected. If a read operation to the array is to be performed, a sense operation is performed in which the contents of the row of capacitors are detected through the selected row of transistors by the column amplifiers. If a write operation is to be performed, a restore operation is performed in which the contents of the column amplifiers are written to the row of capacitors of the array selected through the selected row of transistors. The sense operation is destructive requiring the row of capacitors to be subsequently recharged with a restore operation. As the column amplifiers are latching, the FIG. 2 illustrates a prior art memory system including DRAM with the corresponding control, address and data wires which connect the DRAM to the processor or memory controller component. In one type of DRAM, an asynchronous (unclocked) interface is utilized in which the internal latches are loaded with the control signals. Today, synchronous DRAMs are typically used in which the interface contains internal latches and registers which employ an externally supplied clock source as the time reference. This permits the DRAM to transmit and receive information at a higher rate.

A write access is initiated by transmitting a row address on the address wires and by transmitting the sense control signal (RAS). This causes the desired row to be sensed by the column amplifiers at a time $t_{RCD}$ later. The column address is transmitted on the address wires and the write control signal (CAS) is transmitted along with the first word of the write data WData(a,1). The data word is then received by the DRAM and written into the column amplifiers at the specified column address. This step can be repeated "n" times in the currently sensed row before a new row is sensed. Before a new row is sensed, the old row must be restored back to the memory core and the bit lines of the DRAM precharged. Typically, there are two methods to achieve this in the DRAM. In a DRAM with a non-pulsed word line, every write operation causes the sensed row to be restored to the memory array. Thus, only a precharge is performed prior to the next sense operation. In a DRAM with a pulsed word line, the restore operation is done once just prior to the next precharge forward/sense operation.

FIG. 3 illustrates synchronous write timing when the size of the transmit/receive word, "tr" bits, equals the size of the read/write word, "rw" bits. In the figure, a, b . . . represents a row address; 1, 2 . . . n represent a column address, FIG. 3 illustrates synchronous write timing when the size of the transmit/receive word, "tr" bits, equals the size of the read/write word, "rw" bits. In the figure, a, b . . . represents a row address; 1, 2 . . . n represent a column address, WData [row, col] represents the DRAM address of data word (rw bits) and sense (RAS) is a control signal for initiating a sense operation and WRITE(CAS) and READ(CAS) initiate the write and read operations, respectively, on the column amplifiers. In the present example, the row column address delay timing parameter $t_{RCD}$ is equal to two clock cycles. After the row address is asserted at the first clock cycle, column addresses and write data are asserted after the $t_{RCD}$ delay to write the data into the DRAM array.

A read access is initiated by the processor transmitting a row address on the address wires and by transmitting the sense control signal (RAS). This causes the desired row to be sensed by the column amplifiers. At a time $t_{RCD}$ later, the column address is transmitted on the address wires and the read control signal (CAS) is transmitted. At a time $t_{CAA}$ later, the first word of the read data RData (a,1) is transmitted by the DRAM and received by the processor. This step can be repeated "n" times in the currently sensed row before new row is sensed. Before a new row is sensed, the old row must be restored back to the memory array.

The read timing is illustrated by the timing diagram of FIG. 4. It should be noted that $t_{CAA}$ is the "column address access" timing parameter for the DRAM. This parameter specifies the delay between the issuance of the column address and the access to read data and represents the only real difference between read and write accesses.

It has been recognized that because of the length of time needed to perform a sense operation, it is not necessary for the row and column addresses types of synchronous DRAMs. Therefore, most DRAMs have approximately the same number of rows per array as column bits "sr" per row (wherein sr approximately equals $b^{0.5}$, and b is the number of bits in the array). This maintains the number of row and column address signal lines to be roughly the same.

One trend in the DRAM technology is to increase the rate at which information is transmitted and received. This rate has been increasing in both absolute terms and in relative terms, when compared to the rate at which sense/restore operations and read/write accesses can be performed. FIG. 5 illustrates synchronous write timing, for f=2, when the time it takes to do a read or write access is half as slow as the time for data to be transmitted or received to the DRAM. Thus, in the time it takes to do a read or write access of "rw" bits, "f" words of "tr" bits each may be transmitted or received. In the figure, y, z, denote subfields which are tr bits in width of a data word rw bits in width. In addition, tcycle represents the time during which tr bits are transmitted/received at the DRAM input/output pins. The tread/write time parameter is the time to read/write rw bits to/from the column amplifiers, and $t_{RCD}$ is the time to sense a row and place it in the column amplifiers.

SUMMARY OF THE INVENTION

It is object of the present invention to minimize the number of address control pins and signal lines required to access a DRAM while maximizing the usage such that all DRAM pins approximately have equal information rates at all times.

As interfaces to DRAMs become more advanced and higher performance, the interfaces and signal lines required to support the interface become more expensive to implement. Therefore, it is desirable to minimize the number of signal lines and maximize the bandwidth of the signal lines interfacing to the DRAM in order to take advantage of the high performance of the signal lines in the interface. In the DRAM memory system of the present invention, the address and control lines are combined and the information multiplexed such that the DRAM pins have roughly equal information rates at all times. In particular, the number of column address bits which need to be received in every clock cycle in order to meet the requirements can be determined from the following equation:

$$cap = ceiling(ca/f)$$

where
cap represents the number of address bits received in every clock cycle;
ceiling represents a function returning an integer value greater than or equal to its argument;
ca represents the number of column address bits used every read/write cycle; and
f represents the ratio of rw/tr.

The savings are further realized by the multiplexing of column address bits as the "f" parameter increases in future DRAM technology. Further advantages can be gained by multiplexing the row address with the column address on a single set of wires to a single set of pins in the DRAM. In an alternate embodiment, the data pins of the DRAM are utilized to transmit the row address as the data pins of the DRAM are not in use when the row address is received. Furthermore, the control signals needed to specify a sense or restore operation or a read or write access can also be multiplexed onto the data pins before the time the DRAM needs to receive or transmit data. Thus, for example, in a 16 megabit DRAM, a total of 11 wires connecting to 11 pins of the DRAM are utilized: BusData[8:0] for data, control, row address information and some column address information, BusEnable for the column address, and BusCtrl for specifying whether data or address information is present on the data wires.

In an alternate embodiment, the latency incurred during write operations is programmable to set the latency required for read operation to the latency of a write operation. In this manner, every clock cycle of the data bus can be used for a transfer by interleaving accesses regardless of the mix of read and write accesses.

In addition, in a DRAM with pulsed word lines, three possible states for the column amplifiers are designated, each state having a different set of operations that must be performed in order to sense a new row. The DRAM includes a dirty flag which is set whenever a write access is made to the column amplifiers. The flag is cleared when the column amplifiers are written into the selected row in the memory array by a restore operation. The present invention permits the state of the DRAM, at the time operations with respect to a row are complete, to be left in one of the three states. The state is selected by the control inputs when a read or write access command is specified. If the column amplifiers are dirty after the access has completed, then the column amplifiers may be left in a dirty state. Alternately, a restore operation can leave the column amplifiers in a clean state, and a restore/precharge operation can leave the column amplifiers in a precharge state.

Similarly, if the column amplifiers are clean after access to a row has completed, the amplifiers may be left in a clean state or a precharge operation may be performed to leave the column amplifiers in a precharge state. Although it is generally better to perform as many of these operations as possible at the end of a row access to minimize the amount of time required to perform a sense operation to a new row, in some situations, it may be preferable to address time critical operations and incur the latency at the time a new row is sensed. However, the use of these three states provides the flexibility to reduce the latency of accesses to the new row. If the old row is dirty, a restore/precharge/sense operation must be performed before a read/write access to a different row can be started. If the old row is clean, only a precharge/sense operation must be performed before a read/write access to a different row can be started and it follows that if the old row is precharged, the sense operation must be performed before a read/write access to a different row can be started. Therefore, by providing these three states, the RDRAM can be controlled to minimize the latency of access to a new row in some situations, yet not perform array operations needlessly in other situations.

BRIEF DESCRIPTION OF THE DRAWINGS

The objects, features and advantages of the present invention will be apparent from the following detailed description in which.

DETAILED DESCRIPTION OF THE INVENTION

Figure 1:
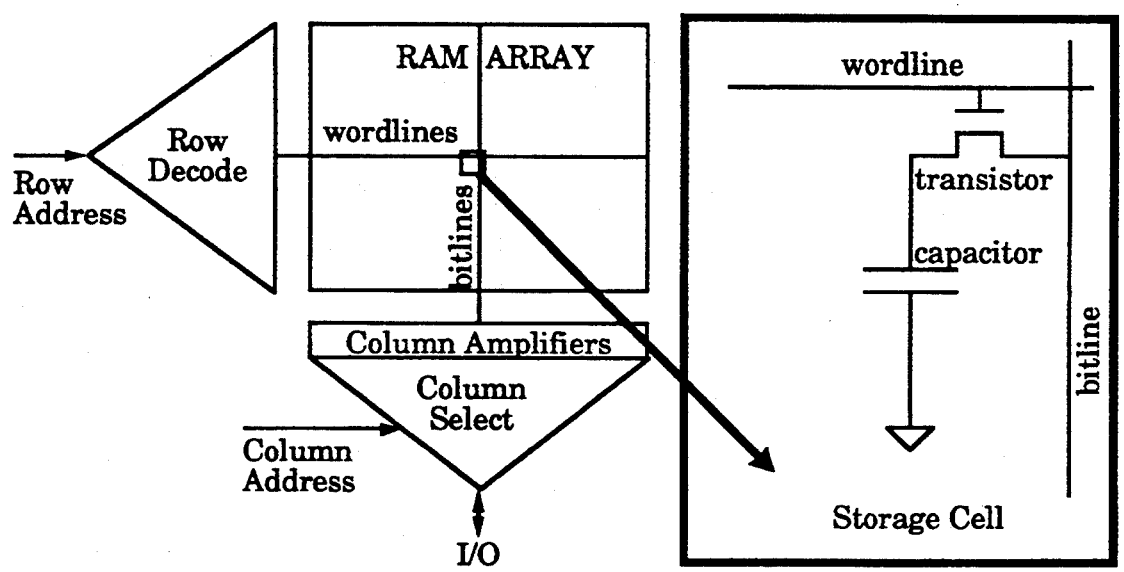
FIG. 1 is a block diagram of prior art dynamic random access memory (DRAM) component.
Figure 2:
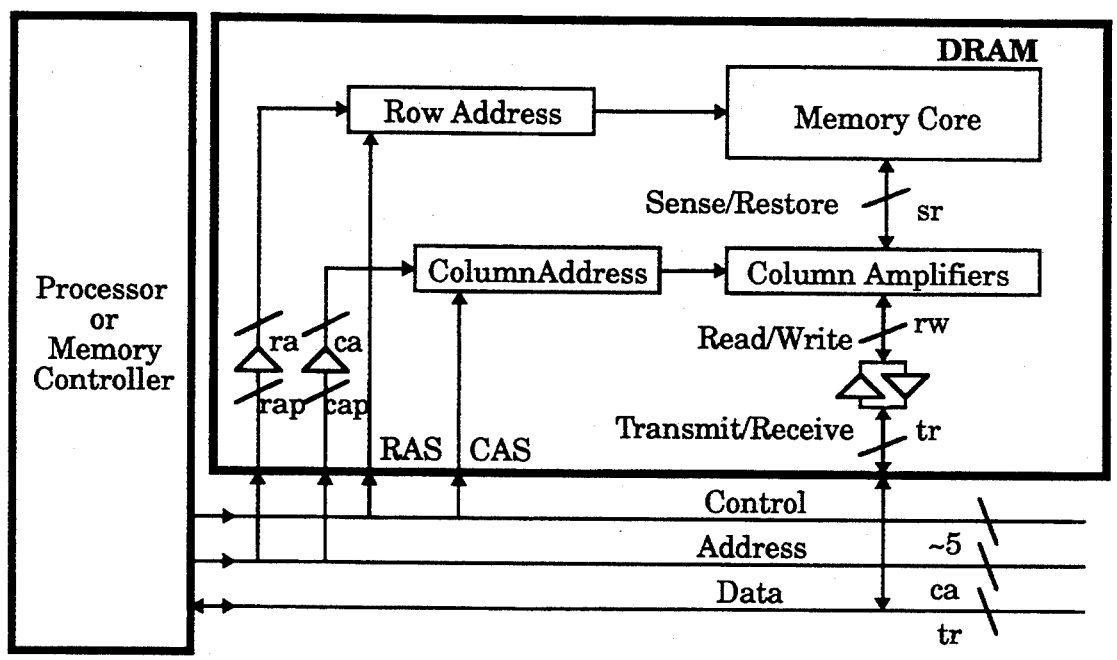
FIG. 2 is a block diagram illustrating a DRAM system and input/output pins and signal lines for accessing the DRAM.
Figure 3:
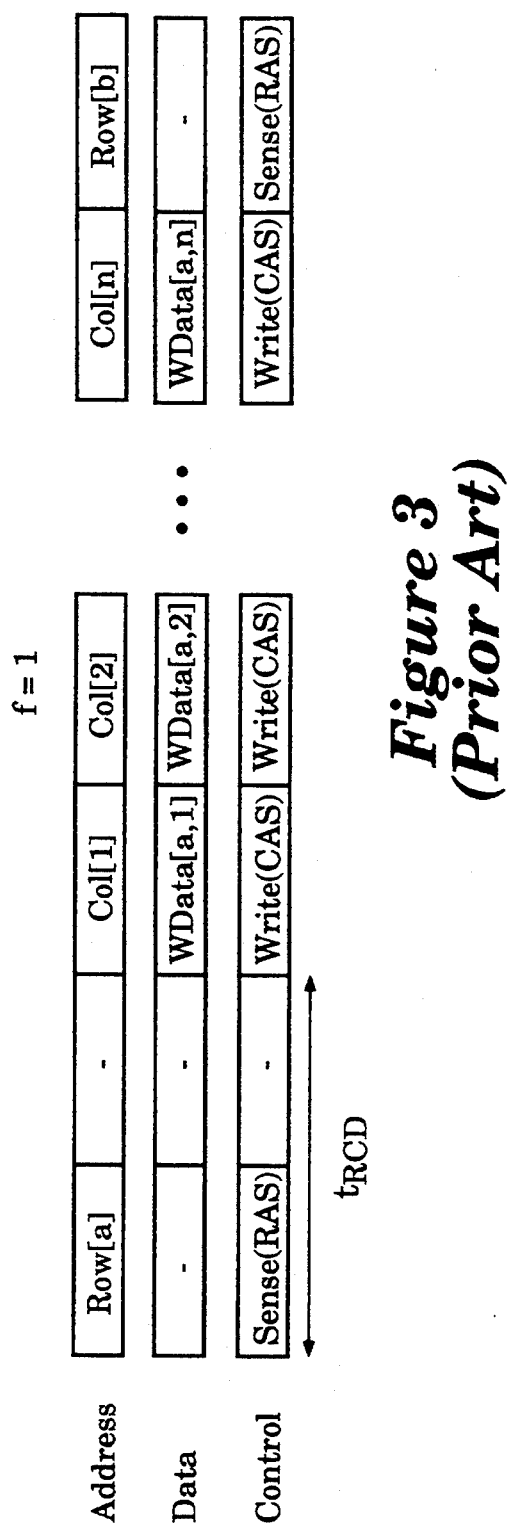
FIG. 3 is a timing diagram illustrating synchronous write timing when the size of the read/write word is equal to the size of the transmit/receive word.
Figure 4:
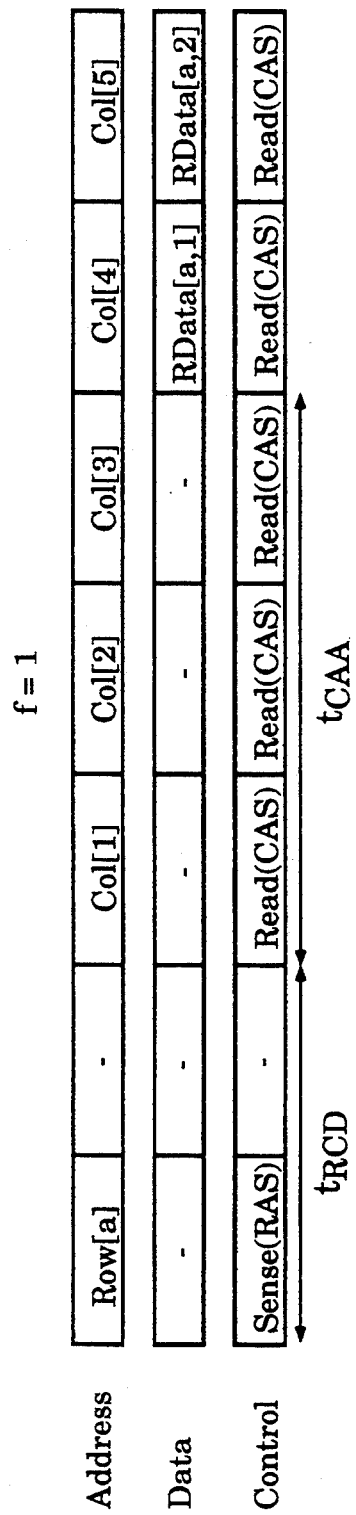
FIG. 4 is a prior art timing diagram illustrating synchronous read timing when the size of the transmit/receive word equals the size of the read/write word.
Figure 5:
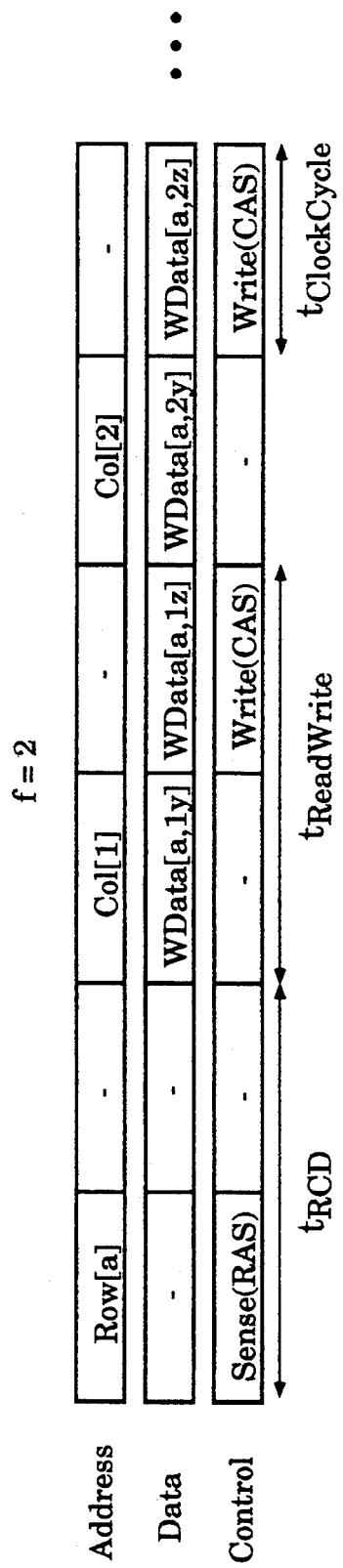
FIG. 5 is a prior art timing diagram illustrating synchronous write timing when the size of the read/write word equals twice the size of the transmit/receive word.

In the following description, for purposes of explanation, numerous details are set forth in order to provide a thorough understanding of the present invention. However, it will be apparent to the one skilled in the art that these specific details are not required in order to practice the invention. In other instances well-known electrical structures and circuits are shown in block diagram form in order not to obscure the present invention unnecessarily.

The present invention is directed to a structure and method for minimizing the number of pins and control information lines required to interface to a dynamic random access memory (DRAM). In the following discussion, the delay which occurs between the issuance of the column address and the receipt of the read data from the DRAM will differ from the delay incurred for writing information to the DRAM after issuance of the column address. However, this is only the distinction between read and write accesses. Therefore, it is apparent that although the following discussion may focus primarily on write accesses, the concepts disclosed are equally applicable to read accesses.

As the rate of transmitting and receiving information continues to increase (relative to the rate at which the sense/restore operations and read/write accesses can be performed), there will be an increase in disparity in the amount of control and address information which must be received by the DRAM relative to the amount of read/write data which must be transmitted/received. Furthermore, as the system is developed to perform a higher data transfer speed, the system becomes more expensive to implement for each line required. Therefore, it is desirable to maximize not only the speed of the input/output pins but also the usage of those pins to take advantage of the speed to increase the bandwidth while reducing costs of implementation. Therefore, signal lines are eliminated by multiplexing the data/control/address information together so that all DRAM pins have roughly equal information rates at all times.

In particular, the following equation can be used to describe the number of column address bits which need to be received in every clock cycle to maximize usage of the pins:

$$cap = ceiling(ca/f)$$

where
cap=the number of address bits received in every clock cycle $t_{ClockCycle}$;
ceiling=a function returning the integer value which is equal or greater than its argument;
ca=the number of column address bits used every read/write cycle $t_{Read/Write}$;
f=rw/tr, where rw=the number of bits read or written from/to column amplifiers in every read/write cycle $t_{Read/Write}$; and tr=the number of bits transmitted or received from/to the DRAM in every clock cycle $t_{ClockCycle}$; and $$t_{Read/Write} = f \cdot t_{ClockCycle}$$

The multiplexing of the column address bits has the potential of saving a large number of pins and signal lines as the "f" parameter increases. For example, f is equal to a value of two in current synchronous DRAMs and is expected to increase to eight or more in future synchronous DRAMs. Although the latency of ($t_{Read/Write} - t_{ClockCycle}$) is introduced into the column address access perimeter $t_{CAA}$ for read access, this delay which is needed to assemble a complete column address for column amplifier is found to be have minimal effect in view of the advantages gained by decreasing the number of pins and signal lines required to perform the access.

In addition, the method the DRAM utilizes to receive the row address can be improved upon. One possibility is to multiplex the row address into the DRAM with the row address bits "rap" which are received per clock cycle to be equal to the number of column address bits "cap" transmitted per clock cycle. This will delay the use of the row address by the amount of time ($t_{Read/Write} - t_{ClockCycle}$) while the row address bits are received and assembled.

Figure 6:
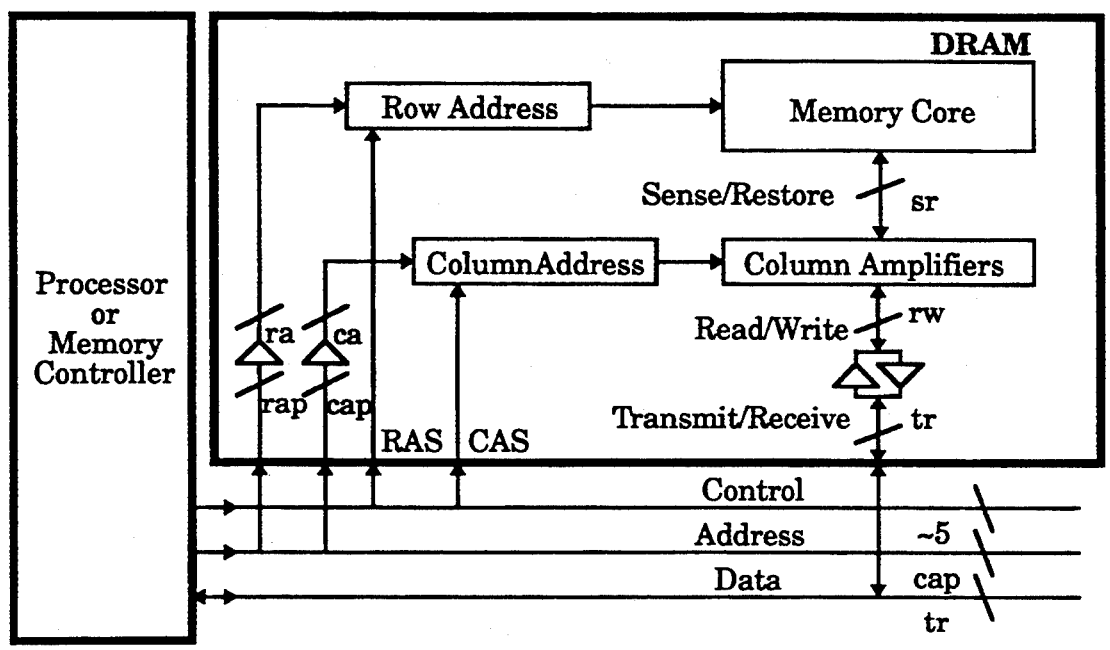
FIG. 6 is a block diagram of a DRAM system in accordance with the teachings of the present invention showing double multiplexed address lines containing row and column address information.
Figure 7:
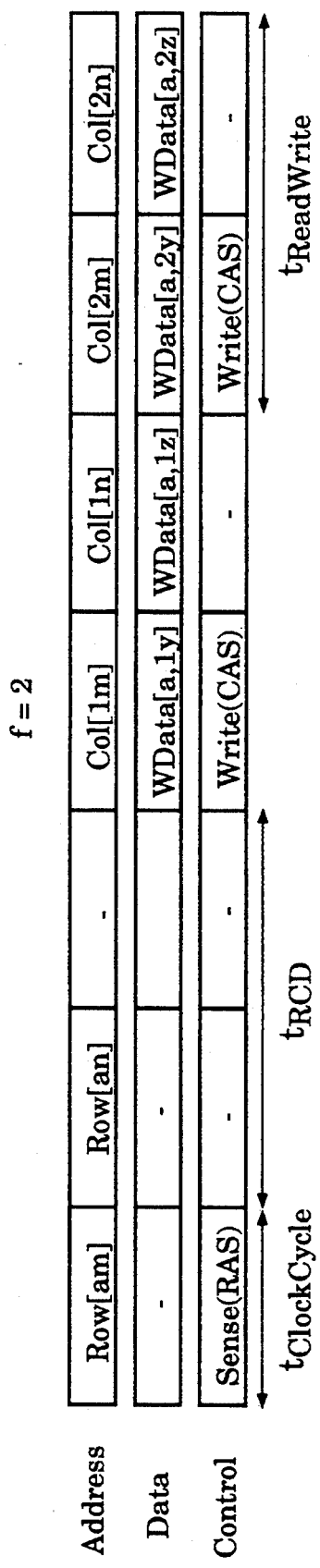
FIG. 7 is a timing diagram which illustrates synchronous write timing with double multiplexed row/column information.
Figure 8:
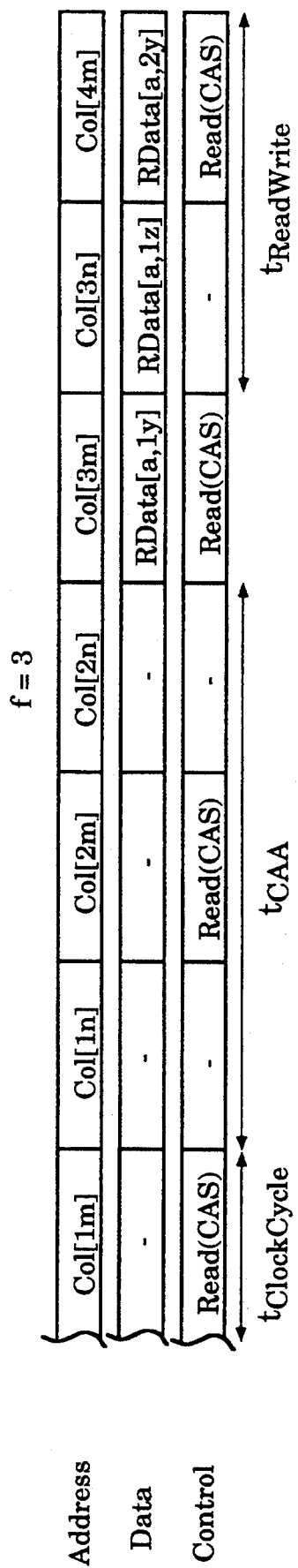
FIG. 8 is a timing diagram which illustrates synchronous read timing with double multiplexed row/column information.

FIG. 6 illustrates a DRAM in which the row address and column address information is "double multiplexed" onto the column address wires (cap) where cap=ceiling(ac/f). FIGS. 7 and 8 illustrate, respectively, the write timing and read timing using a double multiplexed row and column connections. The parameter Col [m,n] represents the subwords of ca/f bits of the column address (which is a total width of ca bits) and Row [m,n] represents the subwords of ra/f bits of the row address. It should be noted that the first three clock cycles are not shown in FIG. 8; however, they are the same as the first three clock cycles shown in FIG. 7. The timing is an example of when f=2; that is, when the number of bits read or written from/to column amplifiers every read/write cycle is twice that of the number of bits transmitted/received from/to the DRAM in every clock cycle. With more advanced transmit/receive technology, f can reach a value of eight or more, permitting the number of address wires to be reduced to one or two. In the present example, the number of address wires has been cut in half, and two clock cycles are required to receive a row or column address. A read/write cycle requires two clock cycles as well. Therefore, for the latency penalty of an additional clock cycle, the number of pins required to access the information is substantially reduced. This, in turn, reduces the costs and complexity of the interface to the DRAM.

Figure 9:
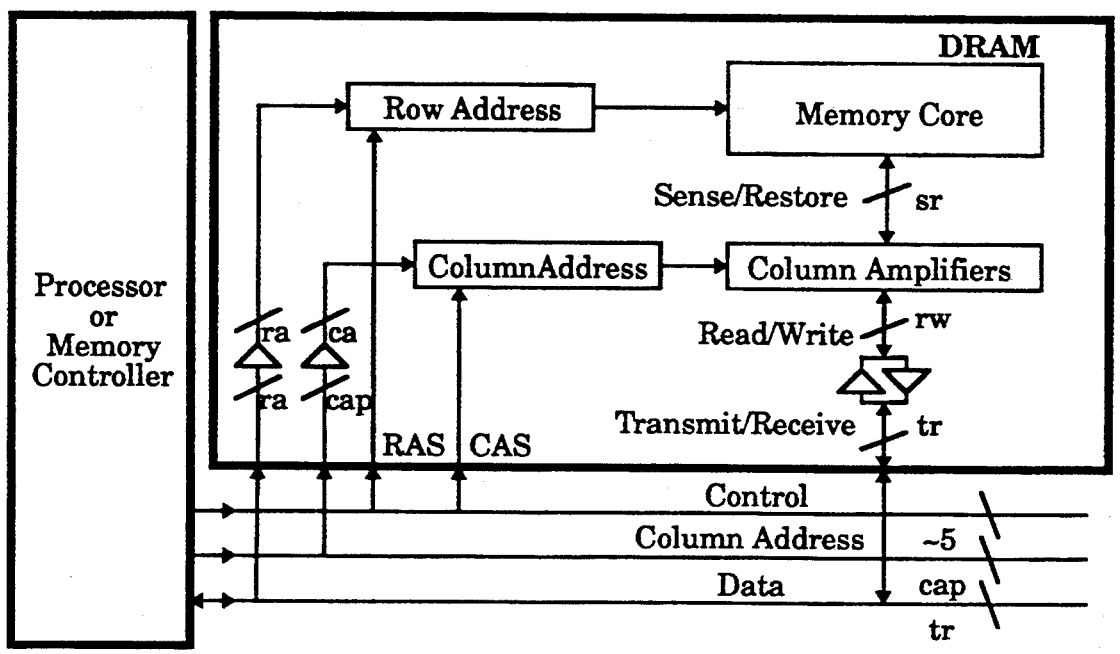
FIG. 9 is a block diagram of DRAM system utilizing multiplexed data/row information.

To further maximize usage on the pins of the DRAM, the row address is communicated across the data pins. This is possible because the data pins of the DRAM are not in use when the row address is transmitted and received by the DRAM. The row address can be received with the data pins in about 1/f the time it takes on the cap column address pins. This is illustrated by the block diagram of FIG. 9 which shows the row address information coming from the data lines and the column address information coming across the column address lines.

Figure 10:
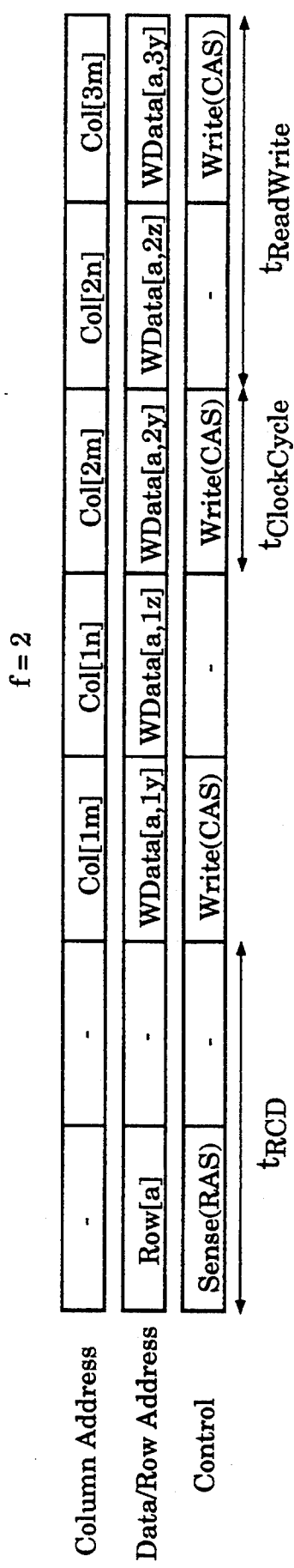
FIG. 10 is a timing diagram illustrating synchronous write timing using multiplexed data/row information.
Figure 11:
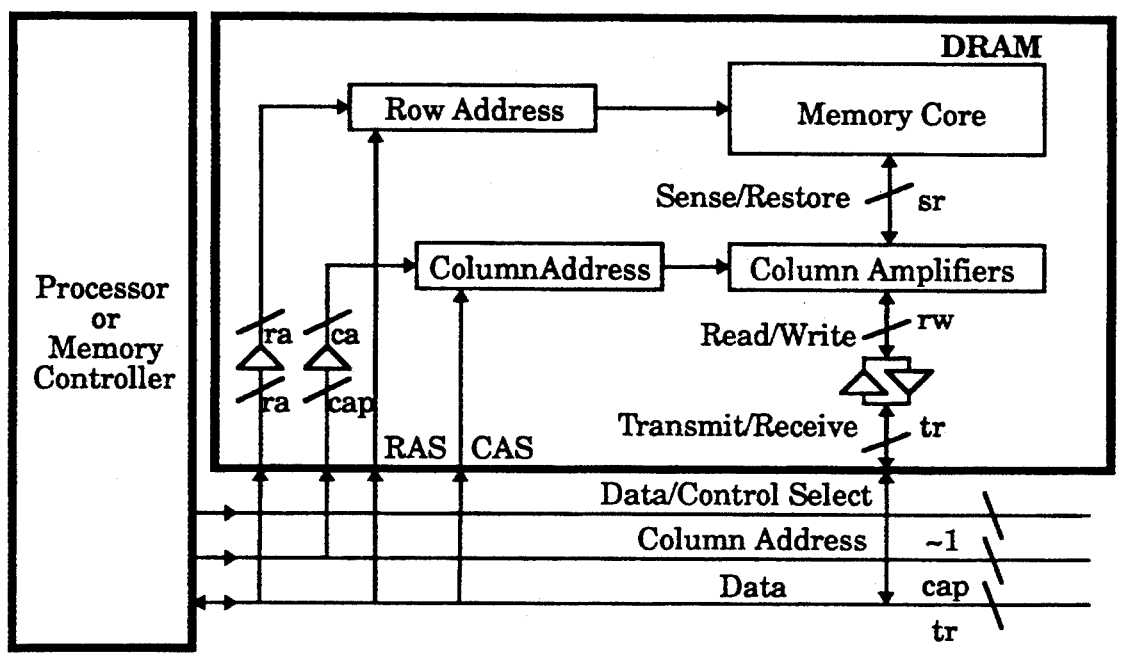
FIG. 11 is a DRAM system block diagram illustrating multiplexed data/row/control information.

FIG. 10 illustrates synchronous write timing using this concept. As shown in FIG. 10, the row address is transmitted across the data lines during an initial clock cycle and the column information is transmitted across the column address lines. If ra>tr, the row address is transmitted across in multiple initial clock cycles. Furthermore, the control signals needed to signal a sense or restore operation or a read or write access can also be multiplexed onto the data pins before the time the DRAM needs to actually receive or transmit data. At least one control wire should remain unmultiplexed to indicate when control and row information is transmitted on the data wires. This control information can simply indicate control/row or data information or can be combined with the internal state of DRAM using a predetermined protocol to indicate the type of information available at the pins. For example, as shown in FIG. 11, the DRAM has "tr" data pins which are multiplexed between data, row address and control information, a data/control select pin, and one or two column address pins.

Figure 12:
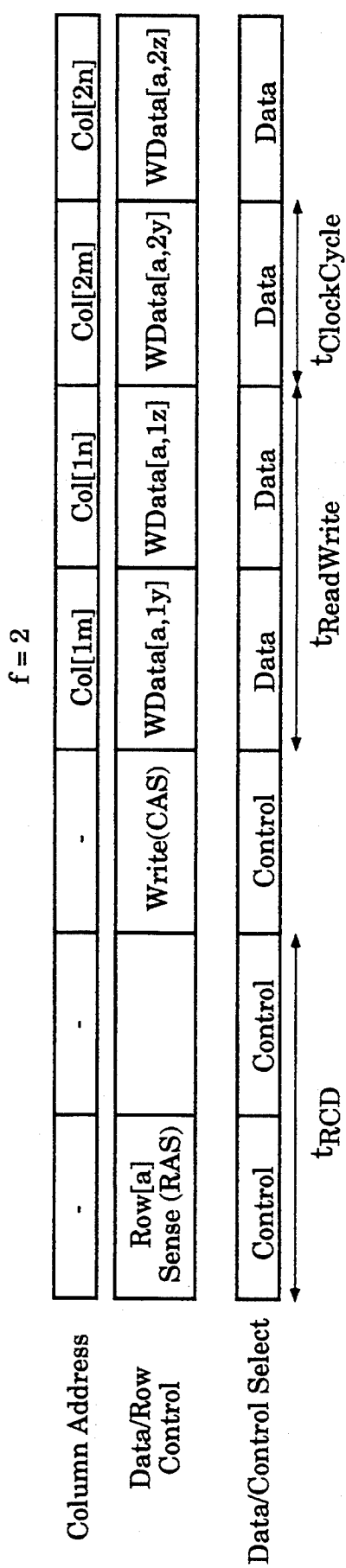
FIG. 12 is a timing diagram illustrating synchronous write timing using multiplexed data/row/control information.
Figure 13:
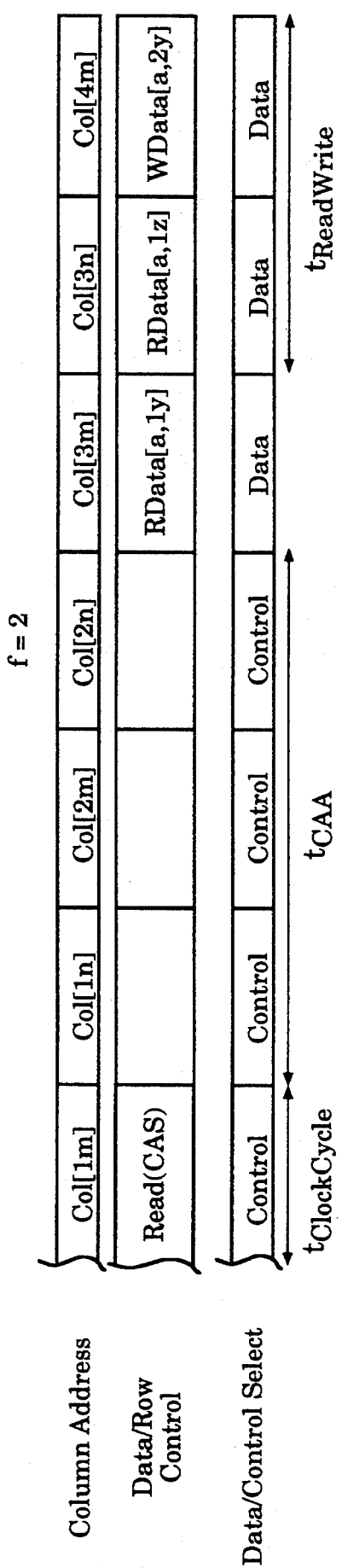
FIG. 13 is a timing diagram illustrating synchronous read timing with multiplexed data/row/control information.

FIG. 12 illustrates synchronous write timing with multiplexed data, row and control information and FIG. 13 illustrates synchronous read timing with multiplexed data, row and control information. It should be noted that with as few as two non-data pins, e.g., the column address pin and the data/control select pin, it is preferable to operate the DRAM in a block-oriented protocol. In particular, when a Write(CAS) access is specified in the third clock cycle, a transfer count is specified to indicate the number of data words (of width "tr") to be transferred. Referring to the read timing of FIG. 13, when the Read(CAS) access is specified, a transfer count is specified at the same time. Thus, the only difference between read and write accesses is the latency $t_{CAA}$ between receiving the Read(CAS) control input and transmitting the first read data word RData-(a,1y).

Because the read and write data is transacted in blocks of rw=f·tr bits, the Data/Control Select pin is not limited to specifying two combinations (data or control). Instead, there are $2^f$ usable combinations assuming that the processor and DRAM can agree on the proper flaming of the f-clock-cycle-long bursts; that is, the f-bit blocks on the Data/Control Select pin must be aligned with respect to the f·tr bit blocks on the Data bus and the f·cap bit blocks on the Column Address bus. One of the function s which can be encoded with the extra combinations is a command to terminate a block transfer, if the protocol can specify transfers that are multiples of the f·tr bit data block size.

For a 16 megabit DRAM using the above innovations, a total of eleven wires can be used. The parameters will be specified as follows:

sr=2048×9 bits
rw=8×9 bits
tr=9 bits
f=8
ra=10 bits (plus 15 bits of device address)
ca=8 bits
cap=1 bit BusData[8:0] is used for data, control and row address information. The pin BusEnable is used to transmit the column address of over multiple clock cycles and BusCtrl pin is used for specifying the presence of data or an address on the data wires. Because f=8, the BusCtrl wire is available for functions other than specifying data or address as there are certain clock cycles when the BusCtrl wire is not used to transmit any particular signals. Therefore, such functions as indicating when a block data transfer is to be prematurely terminated can be implemented.

Figure 14:
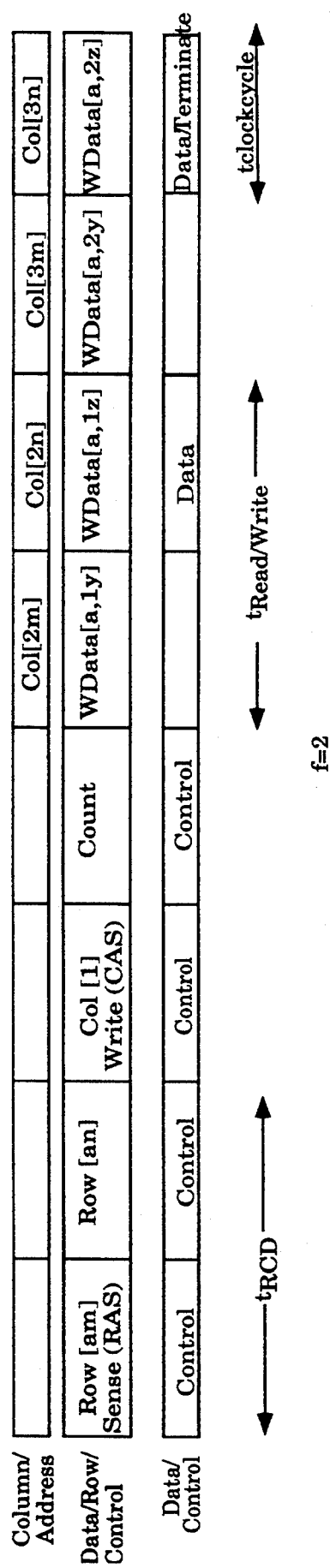
FIG. 14 is a timing diagram illustrating synchronous write timing incorporating a plurality of enhancements in accordance with the teachings of the present invention.

A simplified example, for f=2, is shown in FIG. 14. Referring to FIG. 14, the timing enhancements due to the innovations can be seen. In particular, the data and control signals are paired for transmission across the Data/Row/Control signal lines and the data/control signal line is used to identify the type of information transmitted. In addition, the row address is transmitted across multiple clock cycles to minimize the number of signal lines required. Furthermore, to enhance performance, the first column address is transmitted across the data/row/control signal lines to provide pipelining capability. Subsequent column address information is transmitted across the column address signal lines tread/write clock cycles earlier as shown. Additionally, a count value is transmitted across the data/row/control signal lines to provide the count information necessary in a block oriented protocol. Finally, the data/control signal lines can be used to transmit other control information by encoding of the bits transmitted across one or more (in the present example, two) clock cycles. In the present illustration, a terminate block transfer function is encoded to prematurely terminate a block operation of data.

Figure 15:
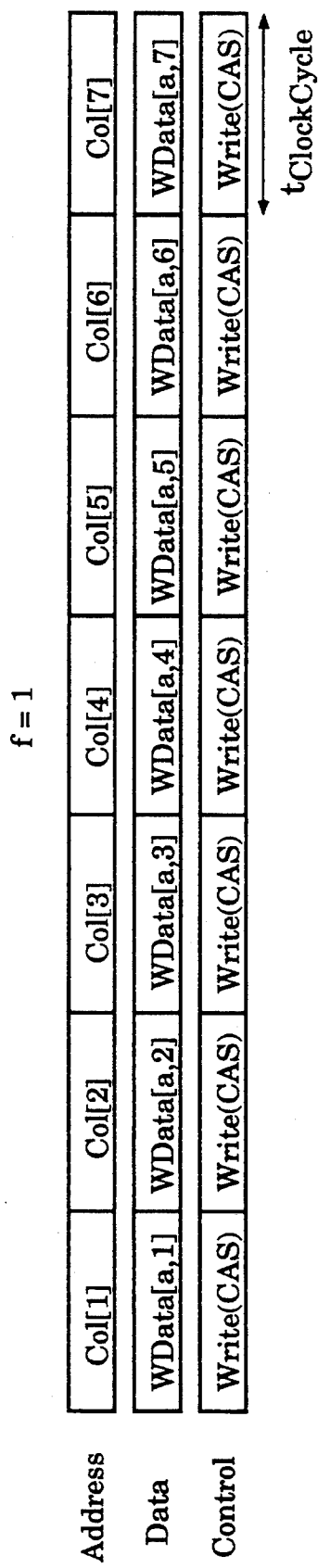
FIG. 15 and FIG. 16 illustrate synchronous write timing and synchronous read timing when a latency incurred during the write operation is less than the latency incurred during a read operation.
Figure 16:
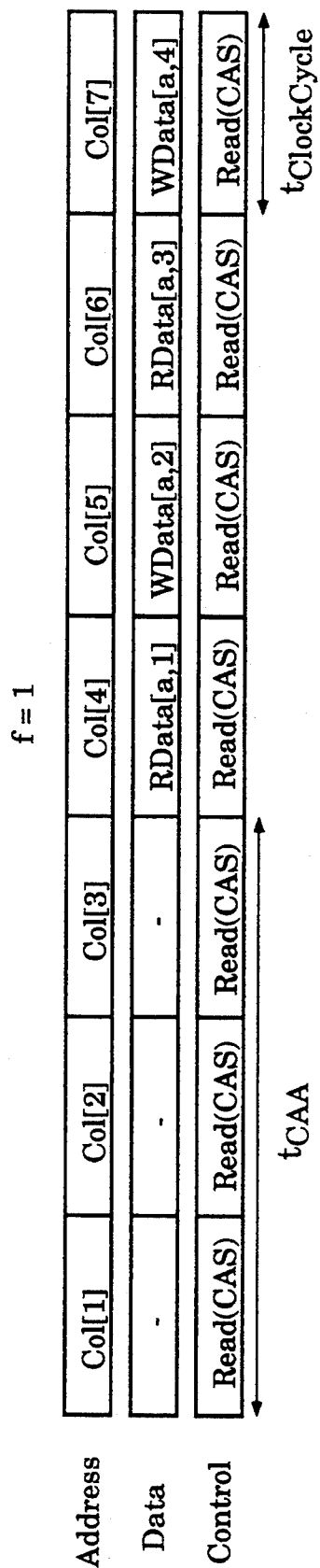

As noted earlier, there is a timing difference between read and write accesses. In particular, the column address access latency $t_{CAA}$ between the clock cycle with the column address and read command and the clock cycle with the first word of read data causes the read timing to be longer from the write timing. This is illustrated in FIGS. 15 and 16. FIGS. 15 and 16 illustrate the simple case when f=1. The latency between the clock cycle with the column address and write command and the clock cycle with the first word of write data is zero. In a read situation, there is a delay of $t_{CAA}$ which occurs. Therefore, there will be wasted clock cycles on the data bus every time a read access is followed by a write access because of this latency difference. To maximize usage and increase the bandwidth of the signal lines, the write latency is made programmable so that it can be adjusted to equal to read latency.

Figure 17:
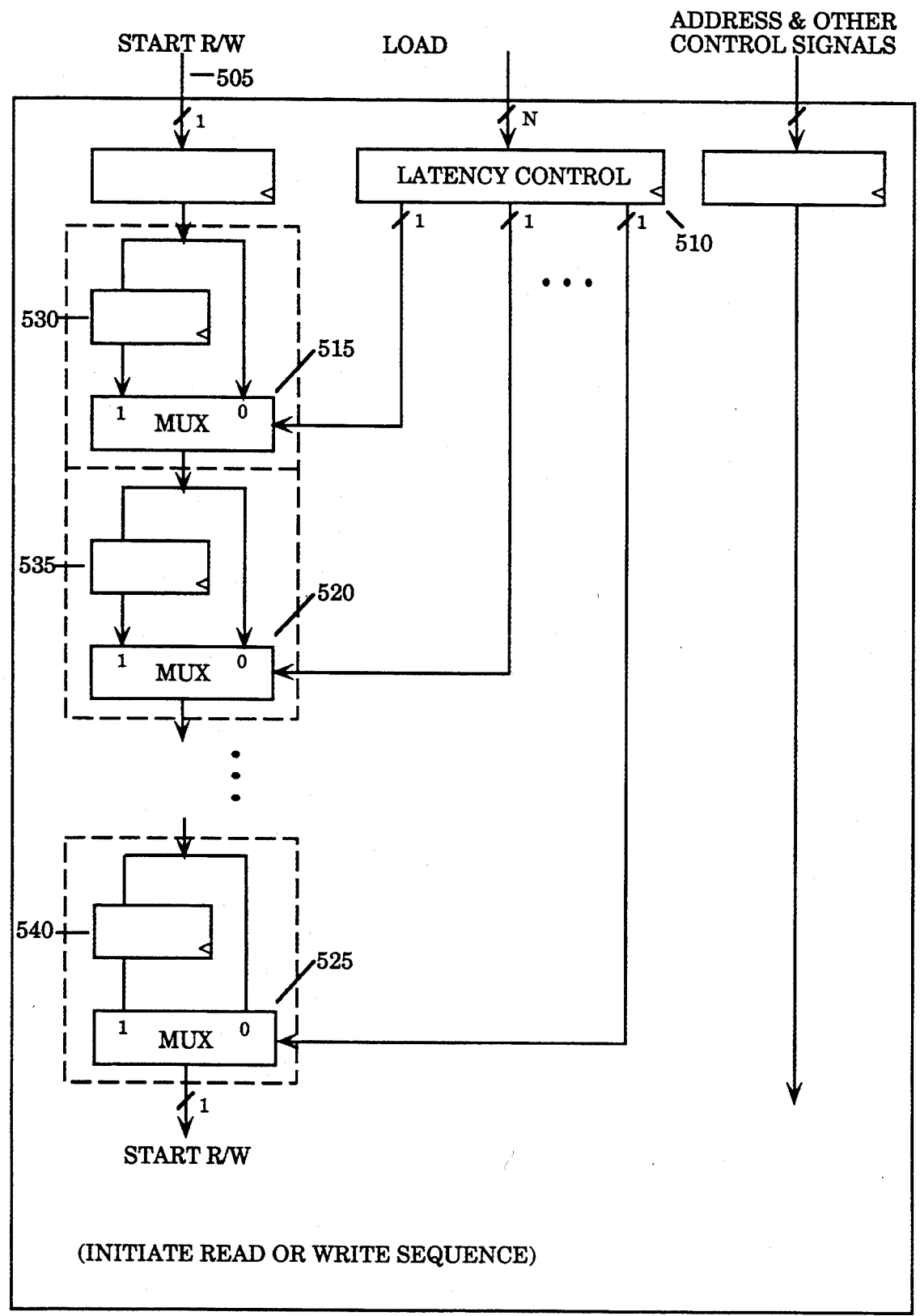
FIG. 17 is a simple, exemplary structure for programming latency in accordance with the teachings of the present invention.

A simple, exemplary structure for programming latency is shown in Fig. 17. FIG. 17 show DRAM control logic 500 which delays a signal to initiate an operation (Start R/W) 505 a certain number of clock cycles dependent upon the information loaded into the latency control register 510. The information loaded into the latency control register 510 controls the operation of the multiplexars 515, 520, 525. In the register the information may be a sequence of one's and zero's identifying the select for each multiplexor or may be in encoded form which is subsequently decoded to generate the multiplexors select input. Selection by the multiplexors 515, 520, 525 determine whether the signal 505 is immediately input or input after a predetermined delay by processing the signal 505 through flip flops 530, 535, 540. Each flip flop 530, 535, 540 delays the signal one clock cycle. It is readily apparent that latency can be programmed using alternate structures. For example, latency can be programmable using a programmable counter to count delays. Alternatively, delays can be inserted by delaying transmission of control signals such that the control signals can be pipelined with other operations in a manner to produce the desired latency. By setting the write latency equal to the read latency every clock cycle of the data bus can be used for a transfer regardless of the types of accesses which are occurring. This is achieved by interleaving the accesses to be performed. This technique maximizes the bandwidth utilization of the bus at the small expense of the write latency.

Figure 18:
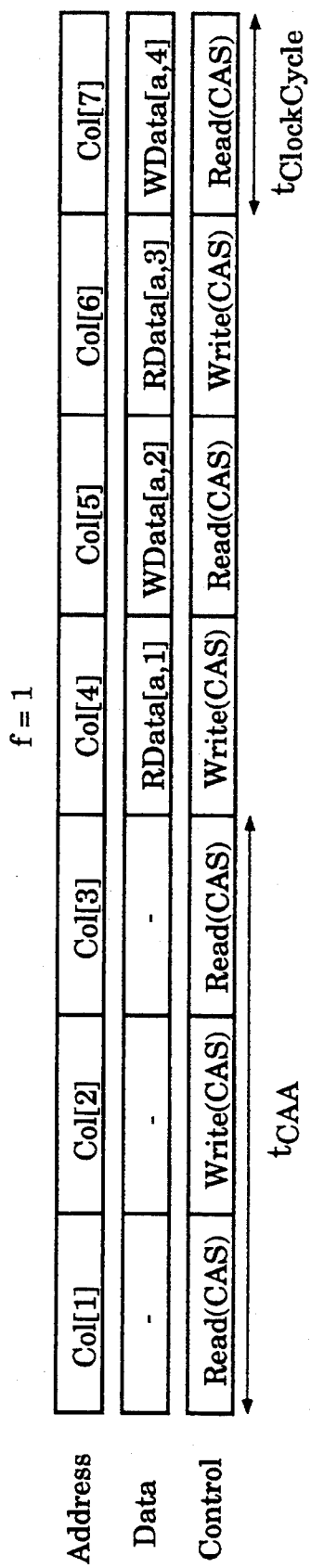
FIG. 18 is a timing diagram illustrating interleaved read/write operation timing when the read latency equals the write latency.
Figure 19:
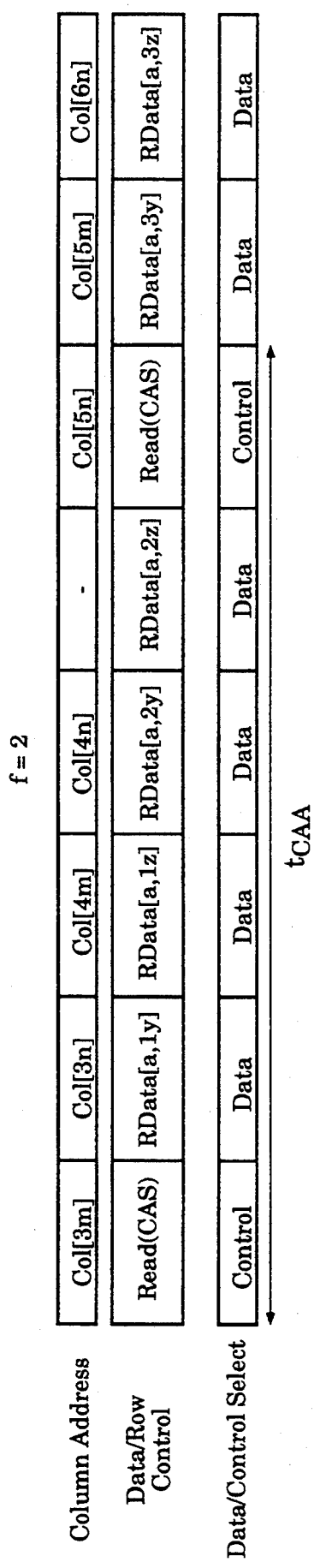
FIG. 19 is a timing diagram which illustrates synchronous interleaved read timing with multiplexed data/row/control information.

FIG. 18 illustrates interleaved timing of read and write accesses. Thus, the interleave structure permits read accesses to a DRAM to be interleaved with write accesses to another DRAM. If a DRAM has multiple independent memory arrays and associated column amplifiers, then read accesses to one bank can be interleaved with write accesses to another bank within the same DRAM further increasing the bandwidth utilization of the DRAM itself. Furthermore, the interleaving will work with the multiplexed address and control information (described above when f>1) which further enhances the operation of the DRAM.

The concept of interleaving can be taken one step further by recognizing that the control in information and row addresses can be multiplexed on the data bus lines as described earlier. Thus, there would be additional benefit to making the range of the read and write latency larger to permit the transfer count and command information (utilizing a block-oriented protocol) to be interleaved on the data bus. This is illustrated in FIG. 17, for f=2. Data from the read command issued in a first clock cycle is deliberately delayed until the seventh clock cycle, when RData[a,3y] RData[a,3z] is available, in order to permit a four-word read or write access to be completed every five cycles. This further maximizes the bandwidth utilization of the data bus at the expense of the read and write latency.

As noted earlier, in a DRAM which utilized non-pulsed word lines, every write operation causes the sensed row to be restored to the memory core; wherein only a precharge operation is performed before the next sense operation on a row. Such DRAMs can be left in a sensed state wherein the column amplifiers contain a copy of one of the rows of the memory array, or the array can be left in a precharged state wherein the column amplifiers and bit lines are precharged and ready for the next sense operation. The choice of these two column amplifiers states may be made with the control inputs when a read or write access command is specified. Probably the precharged state is chosen when the final access has been made to the sensed row. This avoids spending the precharge time $t_{RP}$ before the time $t_{RCD}$ elapses for the next row to be sensed. In a DRAM using pulsed word lines, the restore operation is typically done once, just prior to the next precharge/sense operation. However, this restore operation is only necessary if the column amplifiers are different from the row in the memory array.

Thus, three possible states are provided for the column amplifiers, each utilizing a different set of operations that must be performed in order to sense a new row. The first state is a precharged state in which the column amplifiers and bit lines are precharged. If the row is precharged, the sense operation must be performed before read/write access can be initiated. In the next state, referred to as a clean state, the column amplifiers contain identical information to the row in the memory array. If the amplifiers are in a clean state, a precharge/sense operation must be performed before a read/write access can be started. This, of course, takes a longer period of time than just a sense operation. The third state is the dirty state wherein the column amplifiers contain different information from the row and the memory array. Thus, before a read/write access to a new row can be initiated, a restore/precharge/sense operation must be performed.

To track the state of the row, a dirty flag is utilized. Preferably this flag is a bit in a register located in the DRAM control logic and is set whenever a write access is made to the column amplifiers. Alternatively, the dirty flag can be maintained in an external DRAM controller. The bit is cleared when the column amplifiers are written into the selected row in the memory array by a restore operation. Thus, the DRAM's column amplifiers can be left in one of the three states. The state is selected by the control inputs when a read or write access command is specified. For example, six distinct read and write commands (three read, three write) are provided, each identifying the state the column amplifiers are to be left in at the completion of the access. If the column amplifiers are dirty after the access has completed, then the column amplifiers may be left dirty or a restore operation will leave the column amplifiers in a clean state or a restore/precharge operation will leave the column amplifiers in a precharged state. Similarly, if the column amplifiers are clean after the access has completed, then the amplifiers may be left in a clean state, or a precharge operation will leave the column amplifiers in a precharged state.

Although it is preferable that as many of these operations are performed at the end of an access rather than performing these operations before a new row is sensed, certain timing constraints may require that other alternatives in the sequence of performing operations are utilized. The structure provides the flexibility to leave the row in either of one of three states and perform the operations needed prior to a row being sensed at the end of access to the old row or before access to the new row.

The present invention has been described in conjunction with the preferred embodiment. It is evident that numerous alternatives, modifications, variations and uses will be apparent to those skilled in the art in light of the foregoing description.

What is claimed is:

1. In a dynamic random access memory (DRAM) system comprising at least one DRAM array accessed according to a row address and column address and an array address/control means for receiving address and control information and a data input/output means for receiving data to be written to the array and for transmitting data read from the array, said memory system comprising:

a plurality of bus signal lines for communicating address and control information and data, the number of column address lines which are transmitted each clock cycle in order to communicate the column address information with a low latency is determined according to the following equation:

$$cap = ceiling(ca/f)$$

where cap represents the number of column address bits received in every clock cycle ($t_{clockcycle}$), ceiling represents the function returning the integer greater than or equal to its argument, ca represents the number of column address bits used every read/write cycle ($t_{Read/Write}$), f equals rw/tr, rw and tr represent the number of bits read or written and the number of bits transmitted or received from/to the DRAM in every clock cycle, respectively, and $t_{Read/Write} = f * t_{clockcycle}$;

wherein said DRAM system comprises a minimum number of signal lines by decreasing the number of lines required to send the column address and the data rates through the signal lines and input/output pins of the DRAM are approximately the same to maximize usage of the signal lines.

2. The DRAM system as set forth in claim 1, wherein the row address information is multiplexed with the column address information across column address signal lines, wherein row address signal lines are eliminated.

3. The DRAM system as set forth in claim 1, wherein the row address information is multiplexed with the data communicated over data signal lines, wherein row address signal lines are eliminated.

4. The DRAM system as set forth in claim 1, wherein the row address information, control information indicating whether a sense, restore, read, write operation is to be performed and data are multiplexed across the same set of signal lines, eliminating the need for separate signal lines, said system further comprising a select signal line indicating whether the type of information multiplexed is row address information, control information or data.

5. The DRAM system as set forth in claim 4, wherein the select signal line can communicate a multiplicity of select information across multiple clock cycles.

6. The DRAM system as set forth in claim 4, wherein the row address is transmitted during at least one initial clock cycle.

7. The DRAM system as set forth in claim 4, wherein control signals to sense, restore, read, or write data are multiplexed onto the set of signal lines prior to time the DRAM receiving or transmitting data.

8. The DRAM system as set forth in claim 4, wherein the state of the DRAM and a signal on the select signal line in accordance with a predetermined protocol identify the type of information multiplexed on the set of signal lines.

9. The DRAM system as set forth in claim 5, wherein block transfers are performed in multiples of a f·tr bit data block size, said select information further identifying up to $2^f$ commands.

10. The DRAM system as set forth in claim 9, wherein said select information identifying a command to terminate a block transfer.

11. The DRAM system as set forth in claim 1, wherein eleven signal lines are utilized to communicate data, address and control information to/from a 16 Mbit DRAM.

12. The DRAM system as set forth in claim 11, wherein the signal lines comprise BusData[8:0] to communicate data, control and address information, BusEnable to communicate the column address and BusCtrl[8:0] for specifying data or control information is being communicated over the BusData signal lines.

13. The DRAM system as set forth in claim 1, further comprising:
means for increasing the latency incurred during a write access to equal the latency incurred during a read access;
means for interleaving the read and write accesses to utilize each clock cycle to communicate information across the data signal lines.

14. The DRAM system as set forth in claim 13, wherein the means for increasing the latency is programmable.

15. The DRAM system as set forth in claim 13, wherein the means for increasing the latency comprises:
a latency register for storing information indicative of the duration of the latency;
control means for controlling the latency to be a duration corresponding to the latency indicated by the information stored in the latency register;
wherein the information stored in the latency register can be modified to program the latency.

16. The DRAM system as set forth in claim 13, wherein the means for increasing the latency comprises a programmable counter which counts a number of clock cycles to wait during a write access.

17. The DRAM system as set forth in claim 13, wherein the means for increasing the latency comprises a control means to control the timing of issuance of control signals to perform a write access in order to incur the desired latency.

18. The DRAM system as set forth in claim 1, wherein the system comprises multiple DRAMs using the same signal lines and accesses among the multiple DRAM are multiplexed to maximize usage of the signal lines.

19. The DRAM system as set forth in claim 18, wherein the DRAM comprises multiple arrays, each array having an associated set of column amplifiers, wherein accesses among the arrays are multiplexed to maximize usage of the signal lines.

20. The DRAM system as set forth in claim 1, wherein a first column address is transmitted prior to corresponding data being transmitted such that column addresses are pipelined to enhance performance.

21. The DRAM system as set forth in claim 20, wherein a first column address is transmitted during an initial clock cycle across the data signal lines subsequent to transmission of the row address.

22. In a dynamic random access memory (DRAM) system comprising at least one DRAM array accessed according to a row address and column address and an array address/control means for receiving address and control information and a data input/output means for receiving data to be written to the array and for transmitting data read from the array, a method for transmitting address, control and data between DRAM and a device, said method comprising the steps of:
transmitting address and control information and data across a plurality of bus signal lines, the number of column address lines used to communicate column address information with a low latency is determined according to the following equation:

$$cap = ceiling(ca/f)$$

where cap represents the number of column address bits received in every clock cycle ($t_{clockcycle}$), ceiling represents a function returning an integer greater than or equal to its argument, ca represents the number of column address bits used every read/write cycle ($t_{Read/Write}$), f equals rw/tr, rw represents the number of bits read or written in every clock cycle, tr represents the number of bits transmitted to or received from the DRAM in every clock cycle and $t_{Read/Write}=f*t_{clockcycle}$;

wherein a minimum number of signal lines by decreasing the number of signal lines are used to send the column address, and the data rates through the signal lines and input/output pins of the DRAM are approximately the same to maximize usage of the signal lines.

23. The method as set forth in claim 22, further comprising the step of multiplexing the row address information with the column address information across column address signal lines, wherein row address signal lines are eliminated.

24. The method as set forth in claim 22, further comprising the step of multiplexing the row address information with data communicated across data signal lines, wherein row address signal lines are eliminated.

25. The method as set forth in claim 22, further comprising the steps of:
multiplexing row address information, control information indicating whether a sense, restore, read, write operation is to be performed and data across the same set of signal lines, eliminating the need for separate signal lines; and
issuing at least one select signal across a select signal line to indicate whether the information multiplexed is control information or data.

26. The method as set forth in claim 25, wherein the step of issuing at least one select signal comprises issuing a multiplicity of select information across multiple clock signals.

27. The method as set forth in claim 25, wherein the row address is transmitted during at least one initial clock cycle.

28. The method as set forth in claim 25, wherein control signals to sense, restore, read, or write data are multiplexed onto the set of signal lines prior to time the DRAM receiving or transmitting data.

29. The method as set forth in claim 25, further comprising the step of determining the state of the the DRAM; and identifying the type of information multiplexed on the set of signal lines according to the state of the DRAM and a signal on the select signal line in accordance with a predetermined protocol.

30. The method as set forth in claim 26, wherein said block transfers are performed in multiples of a f*tr bit data block size, said select information further identifying up to $2^f$ commands.

31. The method as set forth in claim 30, wherein said select information identifying a command to terminate a block transfer.

32. The method as set forth in claim 22, further comprising the steps of:
increasing the latency incurred during a write access to equal the latency incurred during a read access;
interleaving the read and write accesses to utilize each clock cycle to communicate information across the data signal lines.

33. The method as set forth in claim 32, wherein the step of increasing the latency comprises the step of programming the latency to a predetermined value indicative of the duration of the latency.

34. The method as set forth in claim 33, wherein the step of programming the latency comprises:
for storing information indicative of the duration of the latency in a latency register;
controlling the latency to be a duration corresponding to the latency indicated by the information stored in the latency register;
wherein the information stored in the latency register can be modified to program the latency.

35. The method as set forth in claim 33, wherein the step of programming the latency comprises the step of counting a number of clock cycles to wait during a write access.

36. The method as set forth in claim 33, wherein the step of programming the latency comprises the step controlling the timing of issuance of control signals to perform a write access in order to incur the desired latency.

37. The method as set forth in claim 22, further comprising the step transmitting a first column address prior to transmitting corresponding data such that column addresses are pipelined to enhance performance.

38. The method as set forth in claim 37, wherein a first column address is transmitted during an initial clock cycle across the data signal lines subsequent to transmission of the row address.

* * * * *